(12) United States Patent
Donolo et al.

(10) Patent No.: US 11,736,051 B2
(45) Date of Patent: Aug. 22, 2023

(54) SYNCHRONOUS MOTOR STARTUP CONFIGURATION TO SYNCHRONOUS MODE AT A FIELD ZERO-CROSSING

(71) Applicant: Schweitzer Engineering Laboratories, Inc., Pullman, WA (US)

(72) Inventors: Marcos A. Donolo, Pullman, WA (US); Anushka M. Dissanayake, Pullman, WA (US); Pallavi Kulkarni, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/815,264

(22) Filed: Jul. 27, 2022

(65) Prior Publication Data

US 2023/0038317 A1    Feb. 9, 2023

Related U.S. Application Data

(60) Provisional application No. 63/229,578, filed on Aug. 5, 2021.

(51) Int. Cl.
*H02P 25/022* (2016.01)
*H02P 21/34* (2016.01)
(Continued)

(52) U.S. Cl.
CPC .......... *H02P 25/022* (2013.01); *G01R 31/343* (2013.01); *H02P 1/46* (2013.01);
(Continued)

(58) Field of Classification Search
CPC combination set(s) only.
See application file for complete search history.

(56) References Cited

U.S. PATENT DOCUMENTS 2,205,253 A    6/1940   Gulliksen
3,408,547 A    10/1968  Saeger
(Continued)

FOREIGN PATENT DOCUMENTS

CH       261489       5/1949
WO     2013004285     1/2013

OTHER PUBLICATIONS

Stanley E. Zocholl, Schweitzer Engineering Laboratories, Inc.—Tutorial: From Steinmetz Model to the Protection of High Inertia Drives, Oct. 2006.
(Continued)

*Primary Examiner* — Bickey Dhakal
(74) *Attorney, Agent, or Firm* — Richard M. Edge

(57) ABSTRACT

A system to reconfigure a motor from induction mode to synchronous mode at a zero crossing of the field voltage during startup using only stator current signals is described herein. The zero crossing may be detected by asymmetry induced in the stator currents by a current asymmetry inducing module of the motor. The current asymmetry inducing module may include a resistor and diode in series and in parallel with a discharge resistor of the field windings. Asymmetry is induced in the current obtained from the stator, and used to determine a zero crossing of the field voltage. Upon the rotor reaching a startup frequency and the detected zero-crossing of the field voltage, the motor may be reconfigured from induction mode to synchronous mode.

20 Claims, 6 Drawing Sheets

(51) Int. Cl.
  *H02P 1/46* (2006.01)
  *H02P 1/50* (2006.01)
  *G01R 31/34* (2020.01)
  *H02P 6/08* (2016.01)

(52) U.S. Cl.
  CPC .................. *H02P 1/50* (2013.01); *H02P 6/08* (2013.01); *H02P 21/34* (2016.02)

(56) References Cited

U.S. PATENT DOCUMENTS

| | | | |
|---|---|---|---|
| 3,818,294 A | 6/1974 | Glukhov | |
| 4,218,718 A | 8/1980 | Sun | |
| 4,547,826 A | 10/1985 | Premerlani | |
| 4,743,818 A | 5/1988 | Quayle | |
| 4,761,703 A | 8/1988 | Kliman | |
| 4,914,386 A | 4/1990 | Zocholl | |
| 5,030,917 A | 7/1991 | Kliman | |
| 5,086,264 A | 2/1992 | Kelledes | |
| 5,276,392 A * | 1/1994 | Beckerman | H02P 25/04 318/774 |
| 5,436,784 A | 7/1995 | Schweitzer | |
| 5,539,601 A | 7/1996 | Farag | |
| 5,548,197 A | 8/1996 | Unsworth | |
| 5,644,510 A | 7/1997 | Weir | |
| 5,684,342 A | 11/1997 | Innes | |
| 5,706,153 A | 1/1998 | Innes | |
| 5,726,911 A | 3/1998 | Canada et al. | |
| 5,761,018 A | 6/1998 | Blakely | |
| 5,793,595 A | 8/1998 | Schweitzer | |
| 5,852,351 A | 12/1998 | Canada et al. | |
| 5,856,903 A | 1/1999 | Smith | |
| 5,872,722 A | 2/1999 | Oravetz | |
| 6,042,265 A | 3/2000 | Kiliman | |
| 6,138,078 A | 10/2000 | Canada et al. | |
| 6,172,509 B1 | 1/2001 | Cash | |
| 6,297,742 B1 | 10/2001 | Canada et al. | |
| 6,308,140 B1 | 10/2001 | Dowling | |
| 6,356,421 B1 | 3/2002 | Guzman-Casillas | |
| 6,456,946 B1 | 9/2002 | O'Gorman | |
| 6,757,146 B2 | 6/2004 | Benmouyal | |
| 6,975,946 B2 | 12/2005 | Al-Hamrani | |
| 7,065,437 B2 | 6/2006 | Mir | |
| 7,123,457 B2 | 10/2006 | Schweitzer | |
| 7,161,778 B2 | 1/2007 | Zocholl | |
| 7,196,884 B2 | 3/2007 | Guzman-Casillas | |
| 7,336,455 B2 | 2/2008 | Dimino | |
| 7,453,674 B2 | 11/2008 | Kuehnle | |
| 7,457,088 B2 | 11/2008 | Hou | |
| 7,468,593 B2 | 12/2008 | Yalla | |
| 7,675,720 B1 | 3/2010 | Zocholl | |
| 8,080,964 B2 | 12/2011 | Hudson | |
| 8,232,760 B2 | 7/2012 | Lu | |
| 8,356,003 B2 | 1/2013 | Chen | |
| 8,373,309 B2 | 2/2013 | Qin | |
| 8,405,944 B2 | 3/2013 | Donolo | |
| 8,484,150 B2 | 7/2013 | Sparling | |
| 8,965,592 B2 | 2/2015 | Manson | |
| 9,383,735 B2 | 7/2016 | Schweitzer | |
| 9,568,514 B2 | 2/2017 | Li | |
| 9,800,088 B2 | 10/2017 | Voloh | |
| 10,054,641 B2 | 8/2018 | Donolo | |
| 10,090,664 B2 | 10/2018 | Schweitzer | |
| 10,739,414 B2 | 8/2020 | Gubba Ravikumar | |
| 11,018,497 B2 | 5/2021 | Donolo | |
| 2003/0076064 A1 | 4/2003 | Kleinau | |
| 2003/0076065 A1 | 4/2003 | Shafer | |
| 2003/0171895 A1 | 9/2003 | Harris | |
| 2004/0260488 A1 | 12/2004 | Al-Hamrani | |
| 2004/0264073 A1 | 12/2004 | Zocholl | |
| 2005/0011177 A1 * | 1/2005 | Wortmann | D02G 1/0266 28/247 |
| 2005/0043873 A1 | 2/2005 | Mir | |
| 2005/0151494 A1 | 7/2005 | Lelkes | |
| 2006/0232237 A1 | 10/2006 | Jadot | |
| 2006/0250102 A1 | 11/2006 | Payne | |
| 2006/0290316 A1 | 12/2006 | Seguchi | |
| 2007/0078614 A1 | 4/2007 | Discenzo | |
| 2007/0132446 A1 | 6/2007 | Kleinau | |
| 2007/0182359 A1 | 8/2007 | Wahler | |
| 2008/0018288 A1 | 1/2008 | Malrait | |
| 2008/0258672 A1 | 10/2008 | Osman | |
| 2008/0315811 A1 | 12/2008 | Hudson | |
| 2009/0284212 A1 | 11/2009 | Turner | |
| 2009/0315329 A1 | 12/2009 | Duffey | |
| 2010/0060227 A1 | 3/2010 | Zocholl | |
| 2010/0194329 A1 | 8/2010 | Lu | |
| 2010/0214709 A1 | 8/2010 | Hall | |
| 2010/0301792 A1 | 12/2010 | Tiwari | |
| 2010/0315033 A1 | 12/2010 | Lu | |
| 2011/0194318 A1 | 8/2011 | Kono | |
| 2011/0213744 A1 | 9/2011 | Sparling | |
| 2011/0279076 A1 | 11/2011 | Hirt | |
| 2011/0313717 A1 | 12/2011 | Lu | |
| 2012/0001580 A1 | 1/2012 | Zhang | |
| 2012/0056570 A1 | 3/2012 | Hudson | |
| 2012/0217908 A1 | 8/2012 | Wu | |
| 2012/0265457 A1 | 10/2012 | Donolo | |
| 2012/0280645 A1 | 11/2012 | Olsson | |
| 2013/0088799 A1 | 4/2013 | Zeller | |
| 2013/0107400 A1 | 5/2013 | Meng | |
| 2013/0314822 A1 | 11/2013 | Dio | |
| 2018/0062552 A1 * | 3/2018 | Donolo | H02P 23/08 |
| 2020/0287481 A1 * | 9/2020 | Huth | H02P 1/50 |

OTHER PUBLICATIONS

E.O. Schweitzer, III, S.E. Zocholl, Aspects of Overcurrent Protection for Feeders and Motors, May 1994.
S.E. Zocholl, Induction Motors: Part I—Analysis, 1996.
S.E. Zocholl, Induction Motors: Part II—Protection, 1996.
Ed Lebenhaft, Mark Zeller, Estimating Key Parameters for Protection of Undocumented AC Motors, Mar. 18, 2008.

* cited by examiner

SYNCHRONOUS MOTOR STARTUP CONFIGURATION TO SYNCHRONOUS MODE AT A FIELD ZERO-CROSSING

RELATED APPLICATIONS

This application claims the benefit under 35 U.S.C. § 119(e) of U.S. Provisional Patent Application Ser. No. 63/229,578 filed on 5 Aug. 2021 titled "Motor Rotor Angle Measurement for Synchronization Using Stator Currents" naming Marcos A. Donolo as the inventor, which is hereby incorporated by reference in its entirety.

TECHNICAL FIELD

This disclosure relates to using stator current measurements to determine synchronization of a motor. This disclosure also relates to inducing stator current asymmetry to detect appropriate timing for conversion from induction to synchronous mode during motor startup.

BRIEF DESCRIPTION OF THE DRAWINGS

Non-limiting and non-exhaustive embodiments of the disclosure are described, including various embodiments of the disclosure with reference to the figures, in which.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric motors are widely used in industry to convert electrical energy into mechanical work. Generally, motors include a stator with windings to produce a rotating magnetic field to drive a rotor. The rotor may include windings to cooperate with the rotating magnetic field. In some configurations the rotor may operate in induction mode, wherein a magnetic field in the rotor windings is induced by the magnetic field produced by the stator windings. In some configurations, the rotor may operate in synchronous mode, wherein the rotor windings generate a magnetic field using an applied current. Various motors are designed to operate only in induction mode; where other motors are designed to operate only in synchronous mode. Still other motors are configured to start up in induction mode, and reconfigure to synchronous mode upon reaching a nominal state (or near a nominal state).

Motors in an induction configuration (or mode) necessarily exhibit some amount of slip, where the rotor rotates slower than the rotating magnetic field of the stator to induce current in the rotor windings. Operation of a motor in induction mode during startup reduces mechanical and thermal stress on various components as compared to operating a motor in synchronous mode during startup. However, at nominal frequency, operation in synchronous mode is more efficient than operation in induction mode. Accordingly, various motors are configured to operate in induction mode during startup until the rotor reaches close to nominal frequency, at which time the rotor is reconfigured to synchronous mode.

Figure 1:
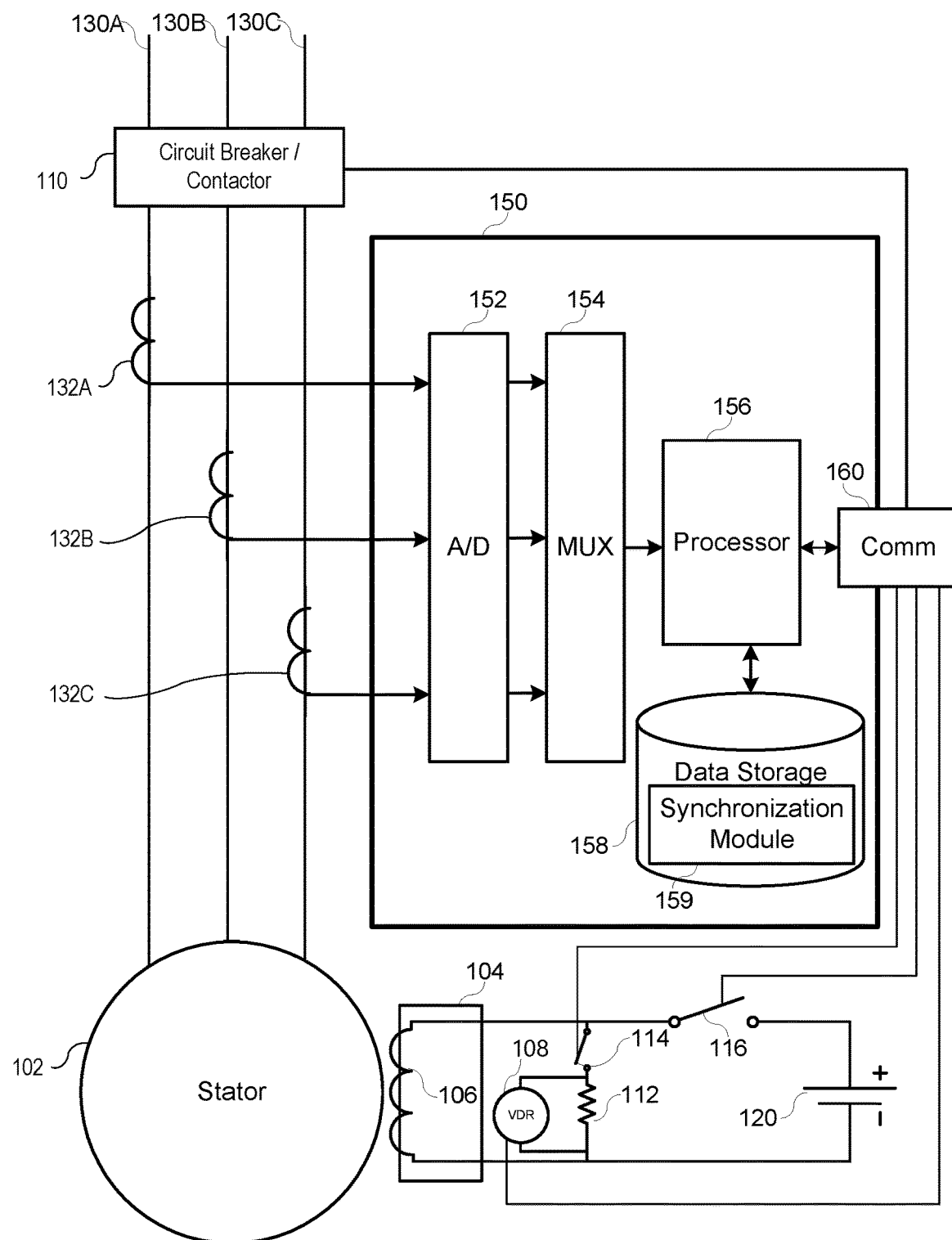
FIG. 1 illustrates a simplified block diagram of a motor for switching between induction and synchronous modes during startup and associated protective device.

FIG. 1 illustrates a simplified block diagram of a synchronous motor that is reconfigurable between induction and synchronous mode during startup. As briefly described above, the rotor 104 of the illustrated synchronous motor may include windings 106 that may be connected to or disconnected from a DC electric power source 120 using switch 116. Switch 116 may be controlled using the intelligent electronic device (IED) 150. The switch 116 may be open in induction mode, and closed in synchronous mode to induce a magnetic field in the windings 106 of the rotor 104 using power source 120.

When disconnected from the DC power source 120 by opening switch 116, the windings may be shorted using a discharge resistor 112 by closing switch 114. With the shorted windings 106, the motor may act as an induction motor, with a current being induced in the field windings 106 of the rotor by the magnetic field produced by the stator windings. The stator 102 may include windings in electrical communication with an AC electric power source such as the illustrated 3-phase AC electric power source 130A, 130B, 130C. When configured in induction mode, a voltage across the discharge resistor 112 may be obtained 108 and provided to the IED 150.

The IED 150 may receive current signals from the current to the motor 130A-C using current transformers 132A, 132B, 132C. IED 150 may be capable of monitoring and protecting the motor using the methods described herein. Some examples of IEDs that may be used include protective relays, motor protective relays, and the like. The three phase current signals from the CTs 132A-C may be provided to a processor 156 via various filters (such as low-pass filters, not separately illustrated), an analog-to-digital converter (A/D) 152, and a multiplexor 154. Various other pre-processing devices and steps may be incorporated as desired. These various other pre-processing devices and steps may be performed on a processor or the like. Further, the pre-processing devices and steps may include a sampler (the A/D may function as a sampler) for sampling the signals. The signals representing the currents from the three phases and other quantities such as temperature from the RTDs, phase voltages, and the like are ultimately provided to a processor (such as a microprocessor, microcontroller, application specific integrated circuit (ASIC), field programmable gate array (FPGA), and the like), where the methods described herein are performed. The IED may include data storage 158 (such as a non-transitory computer-readable storage medium) where the particular modules, calculators, and/or computer instructions for operating the present methods may be stored. Further, values calculated by the processor 156 may be stored using the data storage 158. The IED thus contains various calculators and/or modules for making the various calculations described herein, though the various calculators are not separately illustrated.

The data storage 158 may include computer instructions executable by the processor 156 for monitoring the motor. In particular, such computer instructions may be executable for monitoring synchronization of the rotor of the motor as described herein. Such computer instructions may further be executable to open switch 114 and close switch 116 when synchronization has reached a predetermined threshold. As mentioned above, the motor may be started in induction mode, with the field windings 106 of the rotor 104 disconnected from the DC source 120 and instead closed in series with discharge resistor 112. When the synchronization has reached a predetermined threshold, switch 114 may be opened and switch 116 closed such that discharge resistor 112 is removed from the field winding 106 circuit, and DC power source 120 is introduced into the field winding 106 circuit. Switches 114 and 116 may be operated synchronously such that switch 114 is opened synchronously with the closing of switch 116.

The IED 150 further includes a communication module 160 that is capable of receiving commands from the processor 156 and transmitting such to receiving devices such as circuit breaker 110 and switches 114 and 116. Processor 156 may receive signals from the multiplexor 154. The signals may be digitized analog signals corresponding with current supplied to the windings of the stator 102 by phases 130A-C and obtained using CTs 132A, 132B, and 132C. Processor 156 may execute computer instructions stored in data storage 158 to determine synchronization of the motor using the signals from the multiplexor. Processor 156 may monitor a state of the motor using the determined synchronization of the motor. During startup, the computer instructions may include settings (such as a threshold of synchronization) and instructions for an action for the processor to take once it has determined that the synchronization has reached the threshold. For example, if the motor is a synchronous motor and is being started in induction mode, once the synchronization reaches the predetermined threshold, the processor may act to open switch 114 and close switch 116. Processor may send signals to the switches using the communications module 160.

Communications module 160 may be any module capable of sending and/or receiving electric signals from the processor 156 to other equipment and devices.

Communications module 160 may include one or more various physical interfaces such as, for example, serial or parallel interfaces, contact inputs, contact outputs, or the like. Communications module 160 may include further hardware capable of transforming the signal from the processor 156 for use by downstream equipment or devices, and for transforming signals from devices or equipment for use by the processor 156.

As mentioned above, data storage 158 may include computer instructions executable on the processor 156 for monitoring the motor. The computer instructions may include a synchronization module 159, configured to monitor synchronization of the motor. In one embodiment, the computer instructions may be for monitoring startup of a synchronous motor in an induction mode. The synchronization module may include the computer instructions executable on the processor for estimating a synchronization of the motor using current data from the multiplexor 154 in accordance with the methods described herein. For example, the synchronization module may include computer instructions executable on the processor configured to calculate root-mean squared values from the plurality of current values from the multiplexor, sum the root-mean squared current values, divide the sum by three, subtract a DC component to produce representative current values, determine zero-crossings of the representative current values, and calculate an estimate of synchronization using the zero crossings. In various embodiments, the synchronization module 159 may include instructions that calculate a frequency of the rotor using voltage 108 across the discharge resistor 112, and use the calculated frequency to determine when to reconfigure the rotor from induction mode to synchronous mode. The instructions of the synchronization module may further be configured to reconfigure the motor from induction mode to synchronous mode when the synchronization reaches a predetermined threshold, as described in more detail herein.

After the start and while the motor is still running in induction mode, the motor may draw up to around twice nominal current of the motor. Accordingly, what is needed is to reconfigure the motor from induction mode to synchronous mode as soon as possible. However, reconfiguring the motor from induction mode to synchronous mode before the rotor reaches near synchronous frequency may cause large spikes in current in the stator and the field, resulting in excess wear and possible failure of components thereof. Accordingly, it is desired to optimize the reconfiguration of the motor from induction mode to synchronous mode to occur as close as possible to the moment the rotor reaches a threshold synchronous transition condition.

The optimal threshold synchronous transition conditions may include both a speed of the rotor approaching synchronous speed and transitioning near a zero-crossing of the induced voltage in the rotor. Furthermore, because motors do not always include measuring equipment for the rotor, an apparatus and method for determining the threshold synchronous transition conditions using signals from the stator is desired.

Accordingly, described herein are methods and apparatuses for determining threshold synchronous transition conditions of a motor for reconfiguration from induction mode to synchronous mode. Furthermore, taught herein are methods and apparatuses for determining the threshold synchronous transition conditions using signals from the stator. The methods and apparatuses herein induce an asymmetric current signal in the stator. The methods and apparatuses herein further use the asymmetric current signal to determine a zero-crossing of the field voltage and thus reconfigure the rotor from induction to synchronous mode at or near an appropriate zero-crossing.

Figure 2:
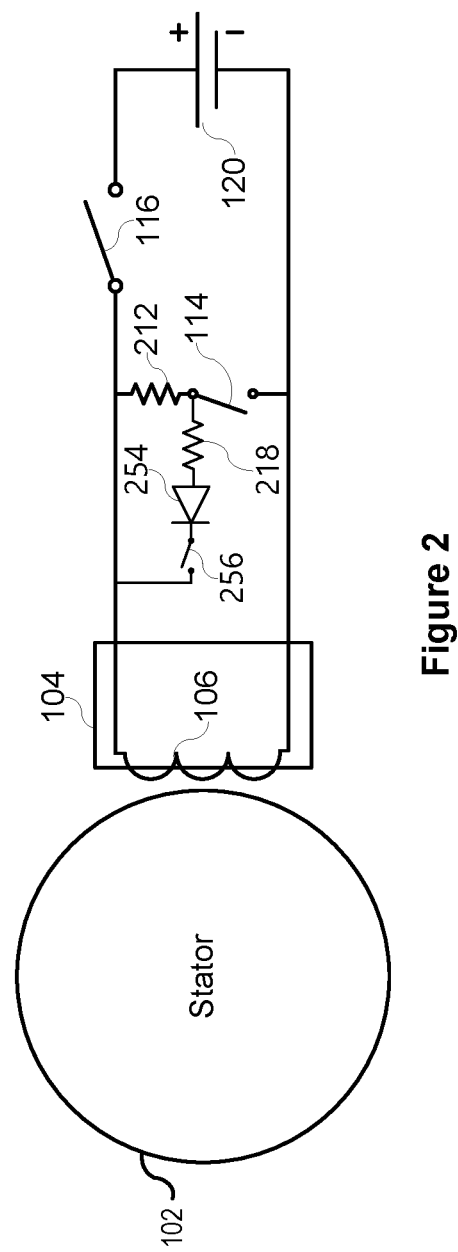
FIG. 2 illustrates a simplified block diagram of a motor including a stator, rotor, and module for inducing an asymmetrical current in the stator in accordance with several embodiments herein.

FIG. 2 illustrates a simplified block diagram of a rotor of a motor for inducing an asymmetrical current signal in the stator and for transitioning from induction mode to synchronous mode in accordance with several embodiments herein. In particular, the rotor 104 may be configured in induction mode with switch 116 open to remove the DC source 120 and switch 114 closed to short the field winding 106 with the discharge resistor 212. The circuitry may include a module for inducing an asymmetrical current signal in the stator. In accordance with several embodiments, the module for inducing an asymmetrical current may be formed by splitting the discharge resistor in such a way that the resistance presented to the positive half of the field voltage is different from the resistance presented to the negative half of the cycle. This can be done with a second discharge resistor 218 in series with diode 254; in parallel with the first discharge resistor 212. This asymmetry causes asymmetric current oscillations in the stator which may be detected using the IED and used to determine the positive half of the field voltage cycle and the positive-going negative transition of the field voltage cycle. The module for inducing asymmetric current oscillations may be selectively connected using switch 256.

Resistors 212 and 218 may be selected to induce an asymmetric signal in the stator. The ratio of the resistors 212, 218 may be selected to increase or decrease the asymmetry for ease of detection by the IED using stator currents.

In accordance with various embodiments, a motor may be started in induction mode with switch 116 open, 114 closed, and 256 closed. Accordingly, the rotor may induce an asymmetrical current in the stator from the initiation of startup. The IED may use the stator currents to monitor the rotational speed of the rotor and to detect zero crossings and to detect positive and negative portions of the voltage cycle induced in the rotor windings by the stator. Upon reaching a predetermined speed (or when a difference between the stator frequency and the rotor frequency is below a predetermined threshold) the IED may command the rotor to reconfigure from induction mode to synchronous mode during a positive-going-negative zero-crossing (PNZ). Such reconfiguration may be performed by closing switch 116 and opening switch 114. Switch 256 may also be optionally opened.

In accordance with various embodiments, a motor may be started in induction mode with switch 116 open, 114 closed, and 256 open. Accordingly, the rotor may not induce asymmetry in the stator current during a first part of motor starting. Upon reaching a predetermined time or a predetermined rotor rotational frequency, the IED may command switch 256 to close, thus engaging the module for inducing the asymmetrical current before reconfiguration from induction to synchronous mode. The IED may then use the stator currents to monitor the rotational speed of the rotor and to detect zero crossings and to detect positive and negative portions of the voltage cycle induced in the rotor windings by the stator. Upon reaching a predetermined speed (or when a difference between the stator frequency and the rotor frequency is below a predetermined threshold) the IED may command the rotor to reconfigure from induction mode to synchronous mode during a PNZ. Such reconfiguration may be performed by closing switch 116 and opening switch 114. Switch 256 may also be optionally opened to remove the asymmetry inducing module from the field windings.

The IED may monitor the motor and reconfigure the rotor from induction mode to synchronous mode using representative current calculated from the stator currents. The representative current may be calculated from a fundamental current obtained from the current to the stator. The fundamental current may be a sum of root-mean squared (RMS) currents from each phase, positive-sequence current, alpha current or the like. The fundamental current may be converted into a representative current by removing a DC component from the fundamental current.

In various embodiments, a composite power may be calculated using current signals and voltage signals to the stator. The composite power may be calculated as a sum of power for each phase, where power for each phase is calculated as the product of the voltage and current for each phase. The composite power may be used as the representative current in the various embodiments described herein.

Figure 3:
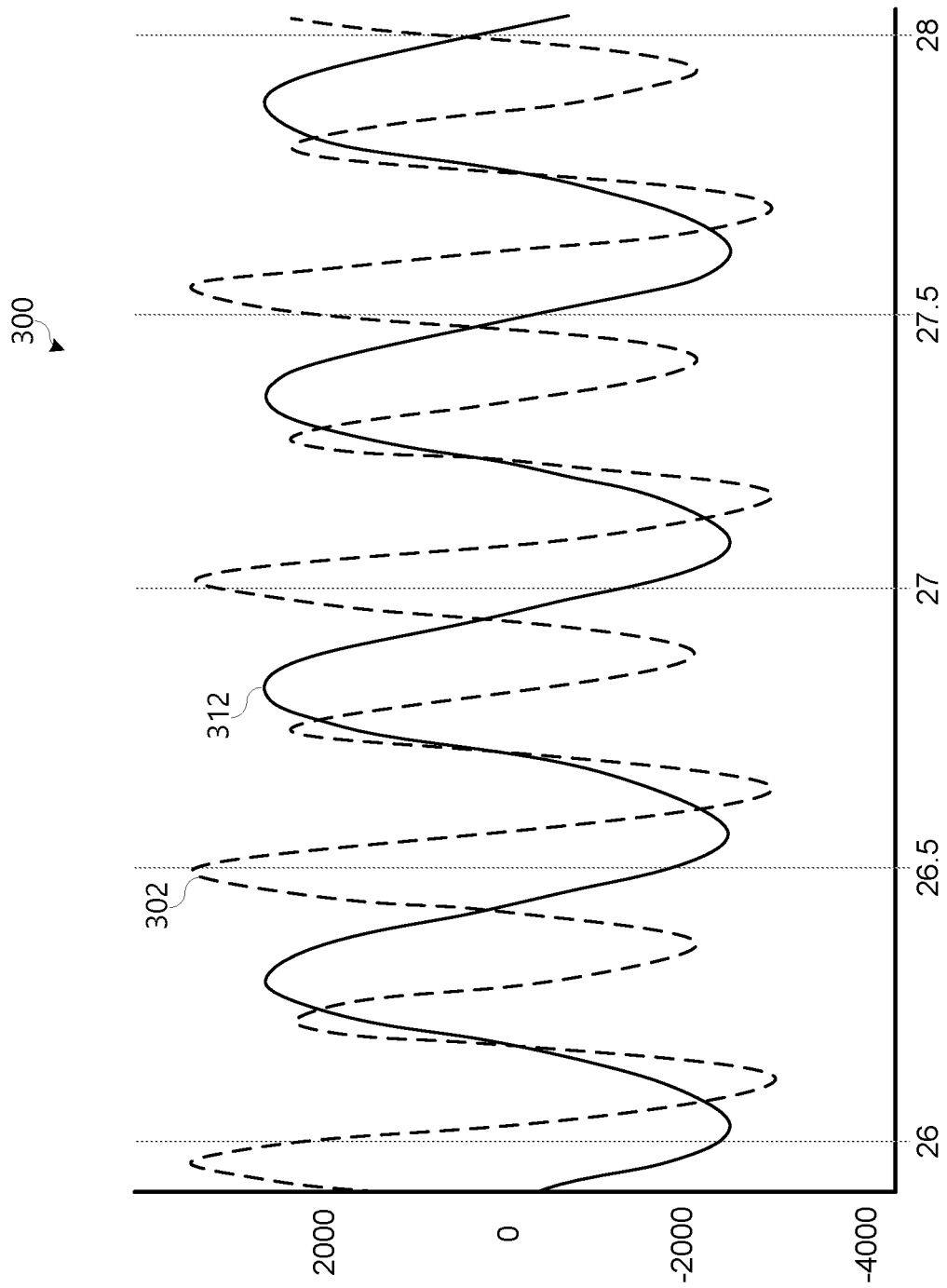
FIG. 3 illustrates a plot of stator representative current and field voltage in accordance with several embodiments herein.
Figure 4:
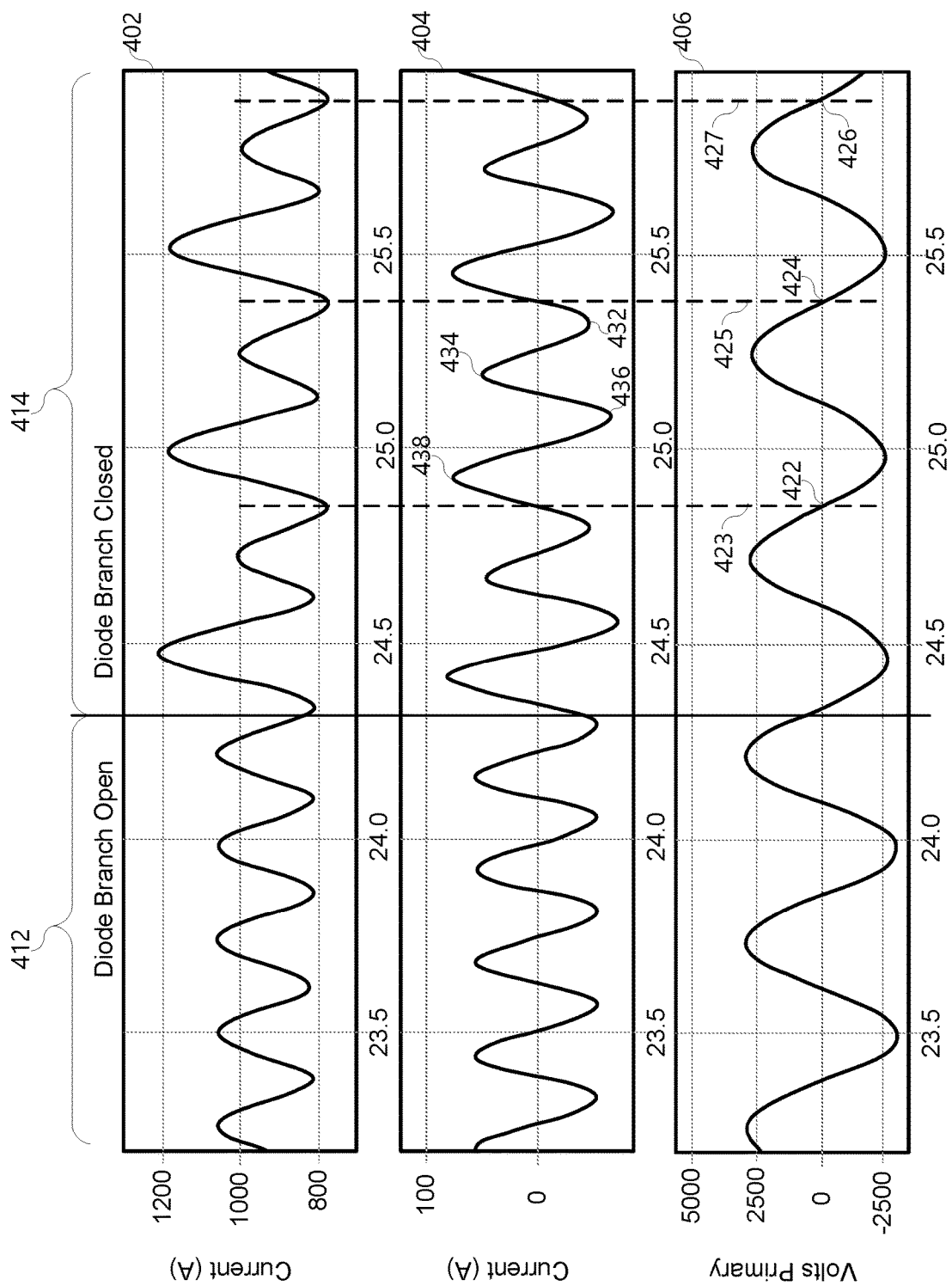
FIG. 4 illustrates plots of fundamental stator current, representative current, and field voltage before and after application of the module for inducing an asymmetrical current in accordance with several embodiments herein.

FIGS. 3 and 4 are provided to illustrate the induced asymmetry in accordance with several embodiments herein. In particular, FIG. 3 illustrates a plot 300 over time of the field voltage 312 and the representative current 302 during motor startup. As can be seen, the frequency of the representative current 302 is around twice that of the field voltage 312. Furthermore, the magnitude of the representative current 302 is greater during the negative half of the field voltage and lower during the positive half of the field voltage. The condition of low representative current 302 magnitude and a negative-going-positive zero-crossing (NPZ) in the signal 302 indicate a PNZ in the field voltage 312. Accordingly, the stator current can be used to determine a condition for reconfiguration of the motor to synchronous mode from induction mode.

FIG. 4 illustrates plots of stator current and field voltage with the module for inducing asymmetry engaged (during time period 412) and disengaged (during time period 414). In particular, the fundamental current 402 is illustrated during periods 412 and 414; and the representative current 404 is also illustrated during periods 412 and 414. The asymmetry is clearly seen once the module has been engaged. In various embodiments the representative current is more useful to determine the PNZ of the field voltage. The asymmetry is clearly seen in the representative current 404 once the module has been engaged.

Also illustrated are PNZs 422, 424, 426 of the field voltage at times 423, 425, 427. It can be seen that the PNZs 422, 424, 426 occur during a transition of the adjusted stator current 404 to the higher magnitude portion of the asymmetric cycle. Accordingly, an IED may monitor the fundamental current 402 magnitude or representative current 404 magnitude to determine a PNZ (or NPZ) of the field voltage. The IED may then command the transition from induction mode to synchronous mode during a PNZ (or NPZ as the case may be). Without the induced asymmetry, stator currents were not useful for determining a PNZ (or NPZ).

A PNZ may be verified using the relative magnitudes of peaks of the representative current 404. For example, PNZ 424 follows two peaks 432, 434 with magnitudes that are less than the previous two peaks 436, 438. That is, a PNZ is detected when the absolute values of each of two sequential peaks of the representative current are each less than the absolute values of the preceding two sequential peaks.

In various embodiments, the fundamental current (e.g. 402) may be calculated using signals obtained from the three phase currents 130A-C to the stator 102. The fundamental current may be calculated as sum of the RMS values for each phase current. The sum of the RMS values may be divided by 3 to produce the fundamental current.

The representative current (or, in various embodiments, the fundamental stator current) may be used to calculate the stator current frequency. The stator current frequency is around twice the frequency of the voltage induced in the rotor windings. During startup of a motor, the voltage induced in the rotor windings experiences a high frequency, which decreases to a value close to zero when reaching synchronous speed. Accordingly, the frequency of the representative may be monitored to determine when the rotor approaches a fundamental frequency. Zero crossings of the representative current may be used to calculate the frequency of the representative current.

In accordance with several embodiments herein, the rotor may be reconfigured from induction mode to synchronous mode after the frequency of the representative current falls below a predetermined threshold. In accordance with several embodiments, the reconfiguration may be instigated during a PNZ of the field voltage. Accordingly, the reconfiguration may be performed when both the frequency of the representative current falls below the predetermined threshold and the PNZ of the field voltage is detected using the asymmetry of the representative current.

In accordance with various other embodiments, a check for PNZ is made by comparing absolute values of the two previous sequential peaks against the absolute values of the two sequential peaks prior thereto. Upon both the frequency threshold being met and the PNZ being detected, the rotor is reconfigured from induction mode to synchronous mode by closing the switch to engage the DC source, and opening switches to remove the discharge resistor from the field winding circuit. After which, the rotor is configured in synchronous mode, and the motor may continue to operate as a synchronous motor.

Figure 5:
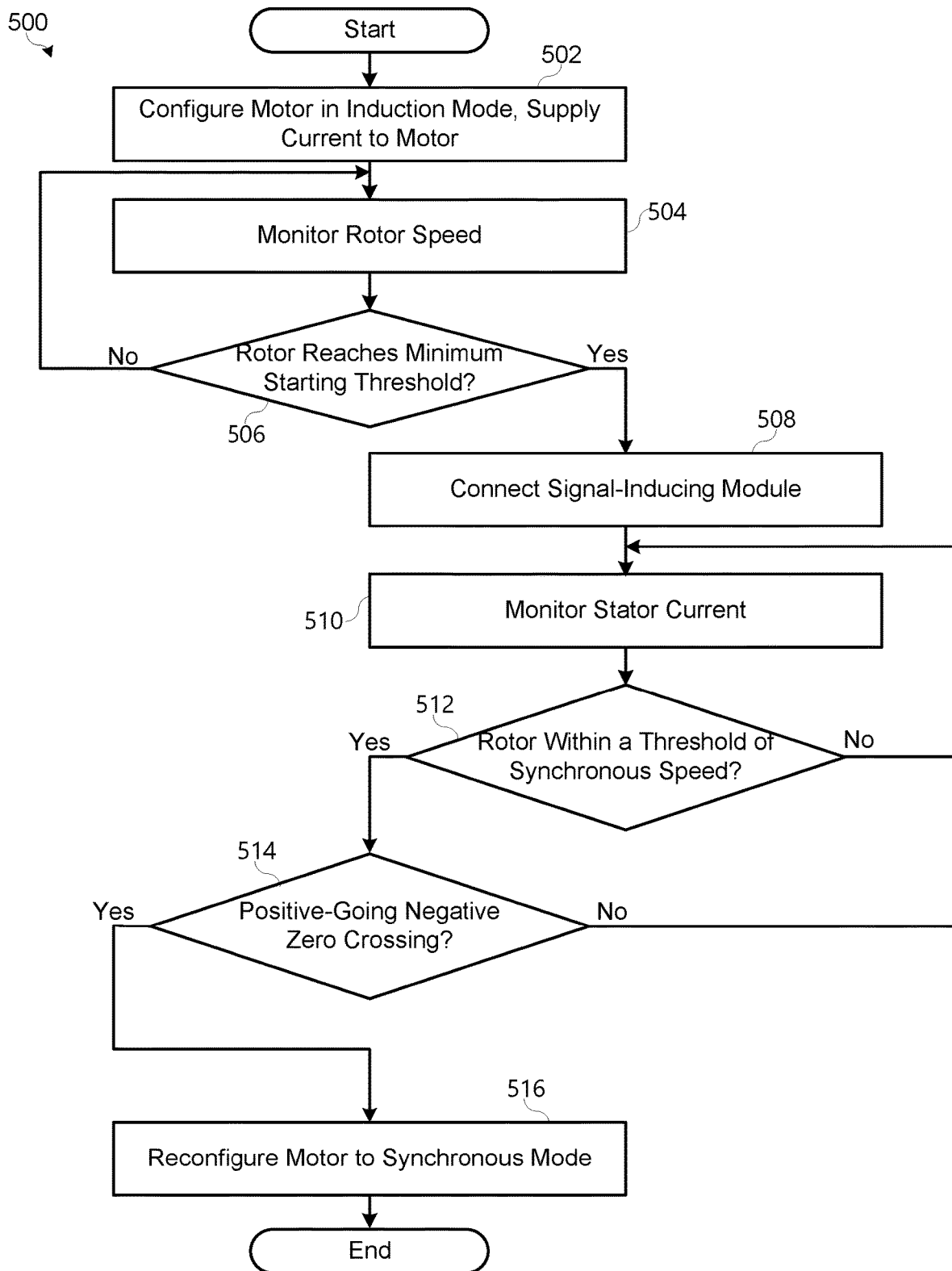
FIG. 5 illustrates a simplified block diagram of a method for starting a motor in accordance with several embodiments herein.

FIG. 5 illustrates a simplified process diagram of a method of optimizing the transition of a motor from induction mode to synchronous mode using stator currents in accordance with several embodiments. The method 500 starts with the motor configured in induction mode, supplying current to the motor 502. As described above, the current is supplied to the stator windings inducing a rotating magnetic field and inducing current in the rotor windings, causing the rotor to start spinning.

As has been discussed above, the rotor may include a module for inducing asymmetry in the stator current. This module may or may not be engaged during the initiation of the startup. The module may be engaged after the rotor has approached a minimum speed. Accordingly, the rotor speed may be monitored 504. The rotor speed may be monitored using any of various methods such as, for example, using stator current, voltage across a discharge resistor, a speed sensor, and the like.

In an embodiment where the module for inducing asymmetrical current in the rotor is not engaged at the initiation of startup, the method may determine whether the rotor has reached a minimum starting threshold. If not, the method continues to monitor the rotor speed 504. When the rotor has reached the minimum starting threshold, the method may engage the module for inducing the asymmetry in the stator current 508. With the module engaged, the asymmetry in the stator current as described herein is induced.

The method may then monitor the stator current 510. As described in more detail above, the stator current may be used to determine the rotor frequency and to detect a PNZ. The method may determine whether the rotor is within a threshold of synchronous speed 512. If it is not, then the stator current is monitored 510. The detection of rotor frequency within a threshold of synchronous speed may be determined using the stator current. The fundamental stator current or the representative current may be used. When the representative current falls below the predetermined threshold, then the rotor is determined as within a threshold of the synchronous speed 512, and the method proceeds to detect a PNZ 514.

The fundamental stator current or the representative stator current may be monitored to detect PNZ as discussed above. Upon detection of PNZ, the method may reconfigure the rotor from induction mode to synchronous mode 516 by connecting the DC power source to the rotor windings and disconnecting the discharge resistor from the circuit with the rotor windings.

In various embodiments, processing, signal and switch delays may be taken into consideration for signaling the motor to reconfiguration from induction mode to synchronous mode. In various installations, there may be delays in processing of signals by the IED, communicating commands from the IED to the motor, and closing/opening of the switches of the motor to effect the reconfiguration. The IED may take into consideration these and other delays, and transmit commands to the motor in advance of the PNZ such that the switching occurs closer to the PNZ. In such embodiments, the IED may maintain a setting of the delay time, and/or the IED may calculate a delay time based on previous commands. Once the rotor has been determined to be within a threshold of synchronous speed 512 and a PNZ has been detected 514, the IED may calculate a time of a subsequent PNZ using the rotor frequency. The IED may send the commands to reconfigure the motor to the synchronous mode at a time that is the estimated time of the subsequent PNZ minus the delay time. Thus, the IED may reconfigure the motor to synchronous mode 516 at an anticipated PNZ in accordance with several embodiments.

Figure 6:
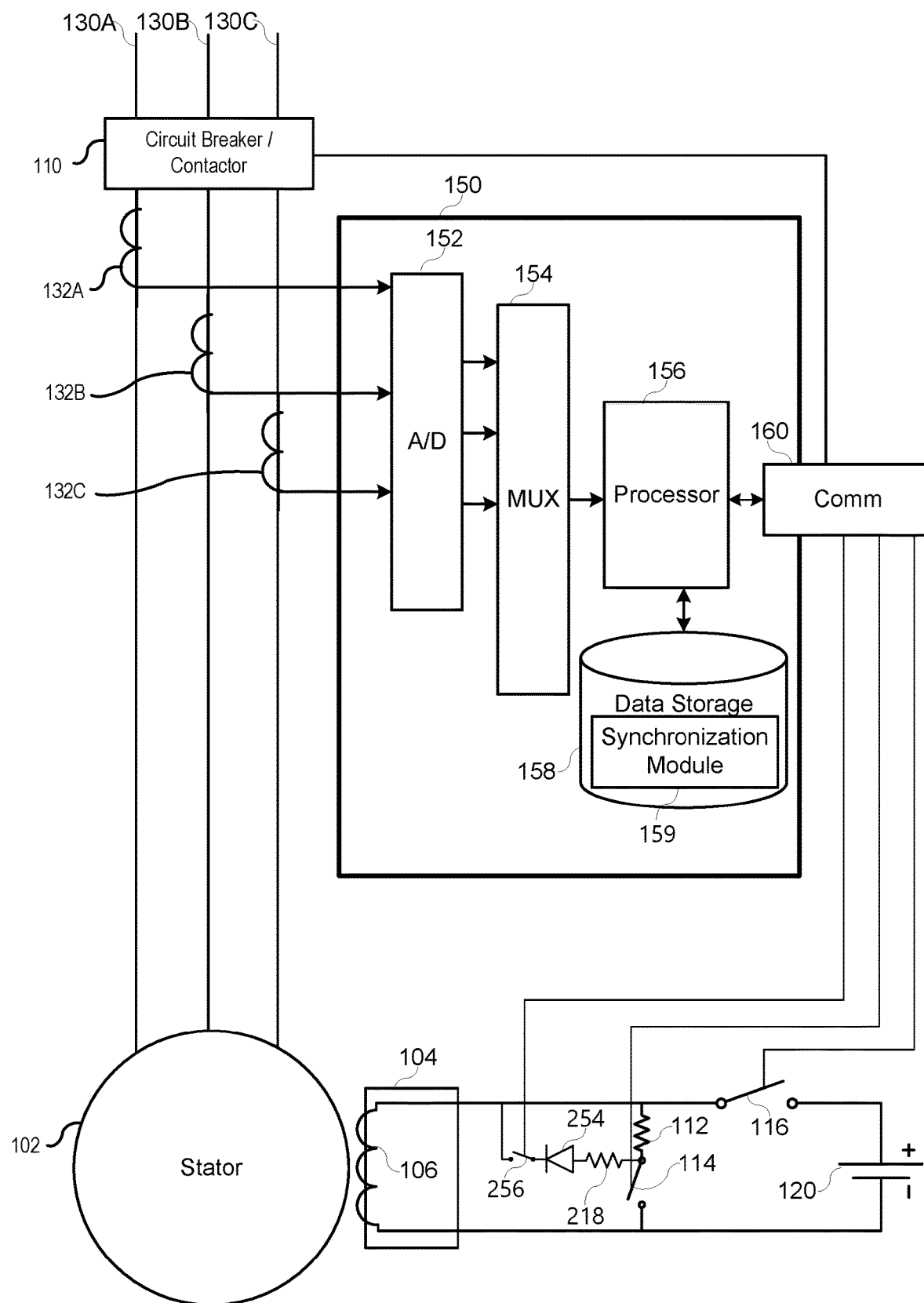
FIG. 6 illustrates a simplified block diagram of a motor and protective device in accordance with several embodiments herein, including the module for inducing an asymmetrical current in the stator.

FIG. 6 illustrates a simplified block diagram of a motor and an apparatus to monitor and protect the motor in accordance with several embodiments herein. The rotor of the motor includes the module for inducing asymmetry in the stator current in the form of resistor 218 and diode 254. The synchronization module 159 of the IED may include computer instructions to monitor stator currents and use the stator currents during startup to signal reconfiguration of the rotor from induction mode to synchronous mode at the optimal moment. The IED may signal switches 116, 114, and 256 to open and/or close via the communications module 160 to effect the reconfiguration between induction mode and synchronous mode.

Although various embodiments herein are described in terms of reconfiguration of the rotor from induction mode to synchronous mode upon a PNZ, various other embodiments may effect reconfiguration from induction mode to synchronous mode upon an NPZ. Furthermore, in various embodiments the connection of the module to induce asymmetry on the stator currents may be made without command from the IED. For example, the rotor may include a centrifugal switch or the like to close switch 256 upon reaching a rotor frequency between zero and the synchronous frequency. Accordingly, the asymmetry is not induced on the stator until after the rotor reaches the threshold frequency. Switch 256 may remain closed even after the rotor is reconfigured to synchronous mode.

In accordance with several embodiments, the asymmetry inducing module may be disengaged from the field windings before the motor is reconfigured to synchronous mode. The asymmetric signal may be used to identify a point on the cycle of the fundamental current or representative current coordinated with the PNZ. Future PNZs may then be determined. Accordingly, various embodiments monitor the asymmetry of the stator current induced by the current inducing module, and determine a PNZ. Once the PNZ and frequency are determined, the asymmetry inducing module may be disengaged by, for example, opening switch 256. Once the rotor is within the predetermined threshold of the synchronous speed, the motor may be reconfigured from induction mode to synchronous mode on a PNZ, where the PNZ is determined using the frequency and previously identified PNZ.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed:

1. An apparatus for monitoring a startup of an electric motor using stator currents, comprising:
    an input for receiving stator phase current signals corresponding with stator currents to a stator of the motor;
    a processor in communication with the input, receiving the stator phase current signals;
    a communications module in communication with the processor and the motor for transmitting commands from the processor to the motor; and
    a non-transitory computer-readable storage medium in communication with the processor, the non-transitory computer-readable storage medium comprising:
        a synchronization module configured to:
            calculate a representative current from the stator phase current signals;
            calculate a frequency of the representative current;
            detect current asymmetry in the representative current, the asymmetry induced by a current asymmetry inducing module of a rotor of the motor;
            calculating a zero crossing of a voltage of field windings of the rotor using the detected current asymmetry; and,
            upon the frequency of the representative current falling below a threshold and detection of the zero crossing, control a configuration of the motor from induction mode to synchronous mode by connecting a direct-current power source to the field windings of the rotor of the motor.

2. The apparatus of claim 1, wherein the zero crossing is a positive-going-negative zero crossing (PNZ).

3. The apparatus of claim 2, wherein the PNZ is detected by comparing magnitudes of sequential peaks of the representative current.

4. The apparatus of claim 1, wherein the representative current is calculated as the alternating current (AC) content of a sum of root-mean squared values of the stator phase current signals.

5. The apparatus of claim 1, wherein the current asymmetry inducing module is engaged after the start of the motor.

6. The apparatus of claim 5, wherein the synchronization module is further configured to engage the current asymmetry inducing module upon the calculated frequency of the representative current falling below a predetermined threshold.

7. The apparatus of claim 1, wherein the control of the configuration of the motor from induction mode to synchronous mode includes disengaging the current asymmetry inducing module.

8. The apparatus of claim 1, wherein the current asymmetry inducing module comprises a resistor in series with a diode in parallel with a discharge resistor of the field windings of the rotor.

9. The apparatus of claim 1, wherein the frequency of the representative current is calculated using zero crossings of the representative current.

10. A method of monitoring a start of a multi-phase electric motor, comprising:
    obtaining stator phase current signals from each phase of current supplied to a stator of the multi-phase electric motor;
    calculating a representative current from the stator phase current signals;
    calculating a frequency of the representative current;
    inducing current asymmetry in the representative current using an asymmetry inducing module of a rotor of the multi-phase electric motor;
    detecting the current asymmetry in the representative current;
    calculating a zero crossing of a voltage of field windings of the rotor using the detected current asymmetry; and
    controlling a configuration of the motor from induction mode to synchronous mode when the frequency of the representative current falls below a threshold and the zero crossing is detected; by connecting a direct-current power source to the field windings of the rotor of the motor.

11. The method of claim 10, wherein the zero crossing is a positive-going-negative zero crossing (PNZ).

12. The method of claim 11, wherein the PNZ is detected by comparing magnitudes of sequential peaks of the representative current.

13. The method of claim 10, wherein the representative current is calculated as the alternating current (AC) content of a sum of root-mean squared values of the stator phase current signals.

14. The method of claim 10, further comprising engaging the current asymmetry inducing module after the start of the motor.

15. The method of claim 14, further comprising engaging the current asymmetry inducing module upon the calculated frequency of the representative current falling below a predetermined threshold.

16. The method of claim 10, wherein the controlling the configuration of the motor from induction mode to synchronous mode includes disengaging the current asymmetry inducing module.

17. The method of claim 10, wherein the current asymmetry inducing module comprises a resistor in series with a diode in parallel with a discharge resistor of the field windings of the rotor.

18. The method of claim 10, wherein the frequency of the representative current is calculated using zero crossings of the representative current.

19. A system for starting a multi-phase electric motor, comprising:
    a stator of the multi-phase electric motor, comprising multi-phase current inputs;
    a rotor of the multi-phase electric motor, comprising:
        a field winding configurable between induction mode and synchronous mode; and
        a switching device for selectively connecting a current asymmetry inducing module with the field winding; and;

an intelligent electronic device (IED) in communication with the multi-phase current inputs and the switching device, the apparatus configured to:

obtain stator phase current signals from the multi-phase current inputs;

calculate a representative current from the stator phase current signals;

calculate a frequency of the representative current;

detect current asymmetry induced on the stator phase current signals by the current asymmetry inducing module;

calculate a zero crossing of a voltage of field windings of the rotor using the detected current asymmetry; and control a configuration of the motor from the induction mode to the synchronous mode when the frequency of the representative current falls below a threshold and the zero crossing is detected.

20. The system of claim 19, wherein the IED is further configured to engage the current asymmetry inducing module after the calculated frequency of the representative current falls below a predetermined threshold.

* * * * *